United States Patent
Pradeep et al.

(10) Patent No.: US 6,277,683 B1
(45) Date of Patent: Aug. 21, 2001

(54) METHOD OF FORMING A SIDEWALL SPACER AND A SALICIDE BLOCKING SHAPE, USING ONLY ONE SILICON NITRIDE LAYER

(75) Inventors: Yelehanka Ramachandramurthy Pradeep; Henry Gerung; Jie Yu; Pei Ching Lee, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/514,900

(22) Filed: Feb. 28, 2000

(51) Int. Cl.[7] .................... H01L 21/8238; H01L 21/336; H01L 21/44

(52) U.S. Cl. .................. 438/200; 438/201; 438/211; 438/230; 438/299; 438/682; 438/683

(58) Field of Search .................... 438/303, 201, 438/211, 682, 683, 155, 200, 230, 299; H01L 21/46

(56) References Cited

U.S. PATENT DOCUMENTS

| | | | |
|---|---|---|---|
| 4,838,991 | 6/1989 | Cote et al. | 156/643 |
| 5,468,665 | 11/1995 | Lee et al. | 437/44 |
| 5,747,373 | * 5/1998 | Yu | 438/305 |
| 5,801,077 | 9/1998 | Chor et al. | 438/305 |
| 5,866,448 | 2/1999 | Pradeep et al. | 438/231 |
| 6,008,077 | * 12/1998 | Maeda | 438/151 |
| 6,020,242 | * 2/2000 | Tsai et al. | 438/279 |
| 6,025,267 | * 2/2000 | Pey et al. | 438/656 |
| 6,063,706 | * 5/2000 | Wu | 438/682 |

* cited by examiner

Primary Examiner—Matthew Smith
Assistant Examiner—Lex H. Malsawma
(74) Attorney, Agent, or Firm—George O. Saile; Rosemary L. S. Pike

(57) ABSTRACT

A process for forming salicided CMOS devices, and non-salicide CMOS devices, on the same semiconductor substrate, using only one silicon nitride layer to provide a component for a composite spacer on the sides of the salicided CMOS devices, and to provide a blocking shape during metal silicide formation, for the non-salicided CMOS devices, has been developed. The process features the use of a disposable organic spacer, on the sides of polysilicon gate structures, used to define the heavily doped source/drain regions, for all CMOS devices. A silicon nitride layer, obtained via LPCVD procedures, at a temperature between 800 to 900° C., is then deposited and patterned to provide the needed spacer, on the sides of the CMOS devices experiencing the salicide process, while the same silicon nitride layer is used to provide the blocking shape needed to prevent metal suicide formation for the non-salicided CMOS devices.

25 Claims, 3 Drawing Sheets ously performed at a temperature between about 800 to 900° C., instead of the use

METHOD OF FORMING A SIDEWALL SPACER AND A SALICIDE BLOCKING SHAPE, USING ONLY ONE SILICON NITRIDE LAYER

BACKGROUND OF THE INVENTION (1) Field of the Invention

The present invention relates to methods used to fabricate semiconductor devices, and more specifically to a process sequence used to form sidewall spacers, and salicide blocking shapes, using silicon nitride.

(2) Description of Prior Art

The use of complimentary metal oxide semiconductor, (CMOS), devices, for both logic, as well as memory applications, fabricated on the same semiconductor chip, have resulted in increased process complexity, as well as increased cost, for the integrated CMOS devices. The ability to share specific process steps, or sequences, used for each type, logic and memory, can significantly reduce process complexity and cost. For example a Self-ALigned metal silICIDE, (salicide), layer, is used with the high performance, CMOS logic devices, while the salicide layer is not desired for CMOS memory applications. A silicon nitride shape is sometimes used to block salicde formation in the CMOS memory region, while being introduced in the CMOS logic area. The silicon nitride layer used for the salicide blocking shape, can however be the second silicon nitride used in the integration of CMOS logic and memory devices. Prior to formation of heavily doped source/drain regions, for both type devices, sidewall spacers, formed from a first silicon nitride layer, are formed on the sides of gate structures, to prevent gate to substrate leakage or shorts. Since the integrity of the sidewall spacer, as well as the quality of the silicide blocking shape, are paramount, high quality silicon nitride layers, in terms of diffusion barrier, are needed for these functions. Therefore these silicon nitride layers are obtained via a low pressure chemical vapor deposition, (LPCVD), procedure, usually performed at a temperature between about 800 to 900° C., instead of the use of plasma enhanced vapor deposition, (PECVD), silicon nitride layers, obtained at temperatures lower than 800° C.

The use of two, high temperature deposited silicon nitride layers, however can exhaust the thermal budget allotted for the fabrication of the integrated CMOS chip,. in terms of unwanted movement of doping profiles. Therefore a novel process sequence, utilizing only a single silicon nitride layer, for both sidewall spacer, and salicide blocking shape, will be presented, removing one high temperature process, thus preserving the thermal budget. The novel process sequence detailed in this present invention, features definition of a silicon nitride blocking shape, in the CMOS memory region, and the formation of a L shaped, silicon nitride spacer, on the sides of CMOS logic gate structures, with both silicon nitride shapes defined from the same LPCVD silicon nitride layer. Salicide formation is then initiated in the CMOS logic region, while the silicon nitride blocking shape protects all CMOS memory regions, during the salicide procedure. Prior art, such as Cote et al, in U.S. Pat. No. 4,838,991, as well as Chor et al, in U.S. Pat. No. 5,801,077, describe the use of organic spacers, on the sides of gate structures, however these prior arts do not describe the process sequence for forming silicon nitride, sidewall spacers, for both memory and logic devices, and a salicide blocking shape, for memory devices, from a single deposition of an LPCVD silicon nitride layer.

SUMMARY OF THE INVENTION

It is an object of this invention to integrate the fabrication of CMOS logic devices, featuring salicide layers, with CMOS memory devices, formed without salicide layers.

It is another object of this invention to use only one silicon nitride layer for the formation of silicon nitride spacers, on the sides of the CMOS logic gate structures, and for the formation of a silicon nitride blocking shape, used to prevent salicide formation in the CMOS memory region.

It is still another object of this invention to use an organic spacer, on the sides of all gate structures, as a mask for definition of heavily doped, source/drain regions.

In accordance with the present invention a method of using one silicon nitride for the formation of silicon nitride spacers, on the sides of CMOS logic gate structures, and for the formation of a silicon nitride shape, located in the CMOS memory region, used to prevent salicide formation in the CMOS memory region, is described. After the formation of gate structures, on an underlying gate insulator layer, lightly doped source/drain,(LDD), regions are formed in an area of the semiconductor substrate not covered by the gate structures. After growing a thin silicon oxide layer, on the gate structures, and on the top surfaces of the LDD regions, a first organic layer is deposited, then subjected to an anisotropic reactive ion etch, (RIE), procedure, to create organic spacers, on the sides of the thin silicon oxide coated, gate structures. After creation of heavily doped source/drain regions, in all regions of the semiconductor substrate, not covered by the gate structures, or by the organic spacers, the organic spacer is selectively removed, followed by the deposition of a silicon nitride layer, and of a second organic layer. A photoresist shape is then used to protect the CMOS memory region from another anisotropic RIE procedure, creating a composite spacer, on the sides of the gate structures in the CMOS logic region, with the composite spacer comprised of the overlying, organic shape, and an L shaped, silicon nitride feature. The blanket, anisotropic RIE procedure removes the exposed portions of the silicon nitride layer, in the CMOS logic region, resulting in exposure of the top surface of the gate structure, and the top surface of the heavily doped source/drain region, while all regions of CMOS memory region remain covered by silicon nitride Removal of the photoresist shape, and of all portions of the second organic layer, followed by a hydrofluoric acid procedure, results in a CMOS memory region, still covered with silicon nitride, and a CMOS logic region, still with the silicon nitride component, of the composite spacer, remaining on the sides of the gate structure, however with the top surface of the gate structures, as well as the top surface of the heavily doped source/drain region exposed. Deposition of a metal layer, followed by an anneal procedure, used to form metal silicide on regions in which the metal layer resided on exposed silicon surfaces, followed by removal of unreacted metal, from the surface of the silicon nitride layer, results in the desired salicide formation, in the CMOS logic region only, with silicon nitride spacers on the sides of the CMOS logic gate structures, and the silicon nitride shape, overlying the CMOS memory devices, all accomplished using only one silicon nitride deposition procedure, protecting these regions from salicide formation.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
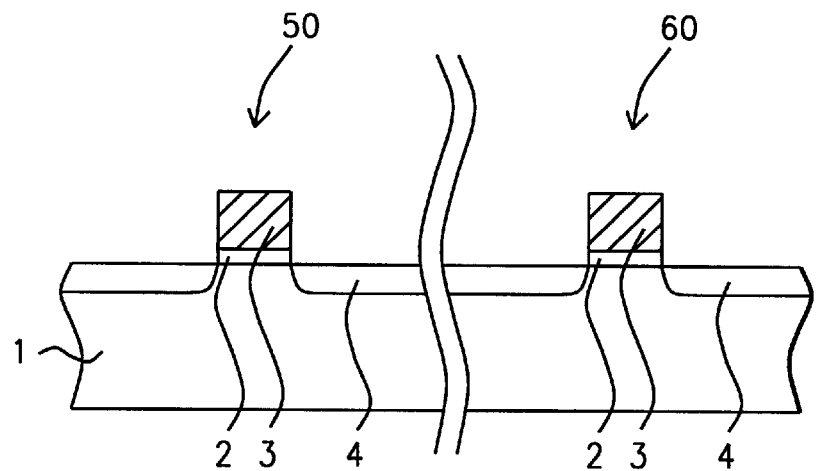
FIGS. 1–7, which schematically, in cross-sectional style, show key stages of fabrication used to form CMOS devices, using one silicon nitride layer to form silicon nitride spacers on the sides of the salicided CMOS logic gate structures, and to form a silicon nitride blocking shape, for non-salicicde CMOS memory devices.

The method of fabricating CMOS devices using one layer of silicon nitride for formation of silicon nitride spacers, on the sides of CMOS logic gate structures, and using the same silicon nitride layer for formation of a silicon nitride blocking shape, used to prevent salicide formation for CMOS memory devices, will now be described in detail. Region 50, shown schematically in FIG. 1, will be used for fabrication of high performance, CMOS logic devices, incorporating metal silicide layers, while region 60, will be used for high density, CMOS memory devices, fabricated without metal silicide layers, or without being subjected to a salicide procedure. This invention will be described for N channel, or NMOS devices, however if desired this invention can be applied to P channel, or PMOS devices. A P type, semiconductor substrate 1, comprised of single crystalline silicon, with a <100> crystallographic orientation, is used, and shown schematically in FIG. 1. A gate insulator layer 2, comprised of silicon dioxide, is obtained via thermal oxidation procedures, at a thickness between about 10 to 100 Angstroms. A polysilicon layer is next deposited via LPCVD procedures, to a thickness between about 1000 to 3000 Angstroms, and either doped during deposition, via the addition of arsine, or phosphine, to a silane ambient, or deposited intrinsically, then doped via implantation of arsenic, or phosphorous ions. Conventional photolithographic and anisotropic RIE procedures, using $Cl_2$ or $SF_6$ as an etchant, are used to form polysilicon gate structure 3, overlying gate insulator 2, in both CMOS logic region 50, and CMOS memory region 60. The selective RIE procedure, using selective etchants, terminates at the appearance of gate insulator layer 2. The photoresist shape, used to define polysilicon gate structures 3, is then removed via plasma oxygen ashing, and careful wet cleans, via use of a buffered hydrofluoric acid procedure, used as part of the wet clean procedure, resulting in the removal of the portions of gate insulator layer, not covered by polysilicon gate structures 3. Lightly doped source/drain regions 4, shown schematically in FIG. 1, are next formed in regions of semiconductor substrate 1, not covered by polysilicon gate structures 3, via implantation of arsenic, or phosphorous ions, at an energy between about 3 to 40 KeV, at a dose between about 1E13 to 1E15 atoms/cm$^3$.

Figure 2:
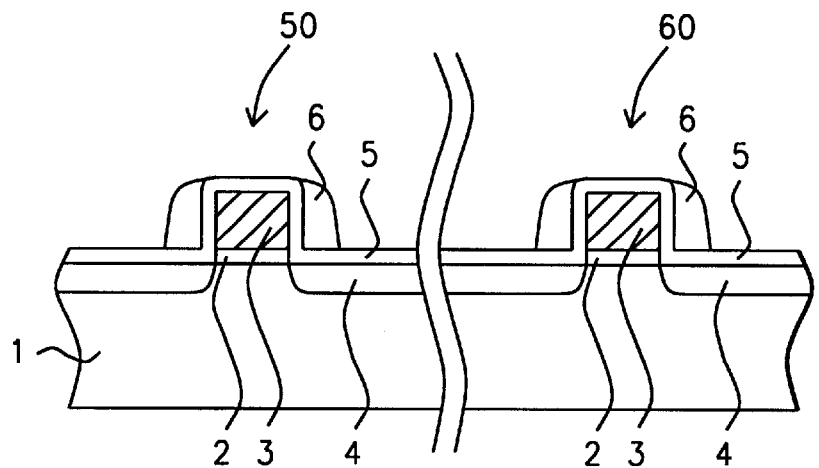
Figure 3:
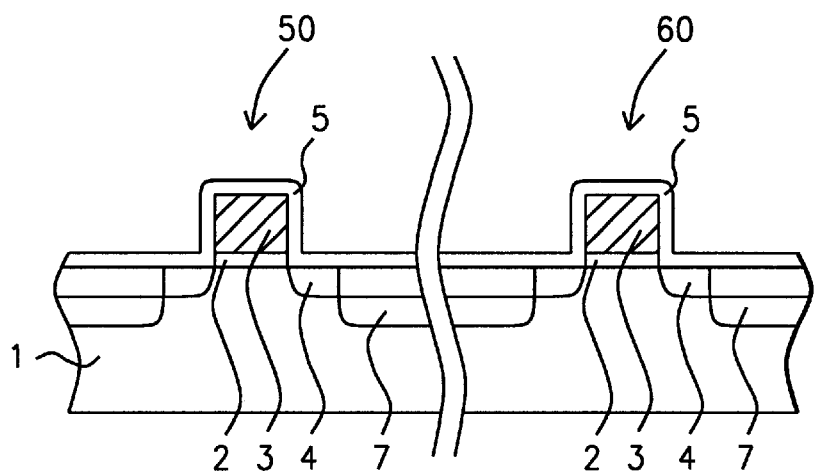

The formation of heavily doped source/drain regions, formed using a disposable organic spacer, will next be addressed and schematically shown in FIGS. 2–3. A thin silicon oxide layer 5, is deposited via LPCVD or PECVD procedures, at a thickness between about 100 to 250 Angstroms, followed by the application of a first organic layer 6, comprised of a material such as propylene glycol monomethyl ether, sometimes used as a bottom anti-reflective coating, (BARC), layer. First organic layer 6, is applied at a thickness between about 600 to 1000 Angstroms. An anisotropic RIE procedure, using $CF_4/HBr/O_2$ or $Cl_2/O_2$ as an etchant, is used to etch first organic layer 6, selectively stopping at the appearance of underlying, thin silicon oxide layer 5, and creating organic spacers on the sides of all gate structures. This is schematically shown in FIG. 2. Implantation of arsenic, or phosphorous ions, is next performed, at an energy between about 30 to 100 KeV, at a dose between about 1E15 to 1E16 atoms/cm$^2$, creating heavily doped source/drain regions 7, in areas of semiconductor substrate 1, not covered by gate structures 3, or by the organic spacers formed from first organic layer 6. The organic spacers are then removed via plasma oxygen ashing, or via wet procedures. The result of these procedures is schematically shown in FIG. 3.

Figure 4:
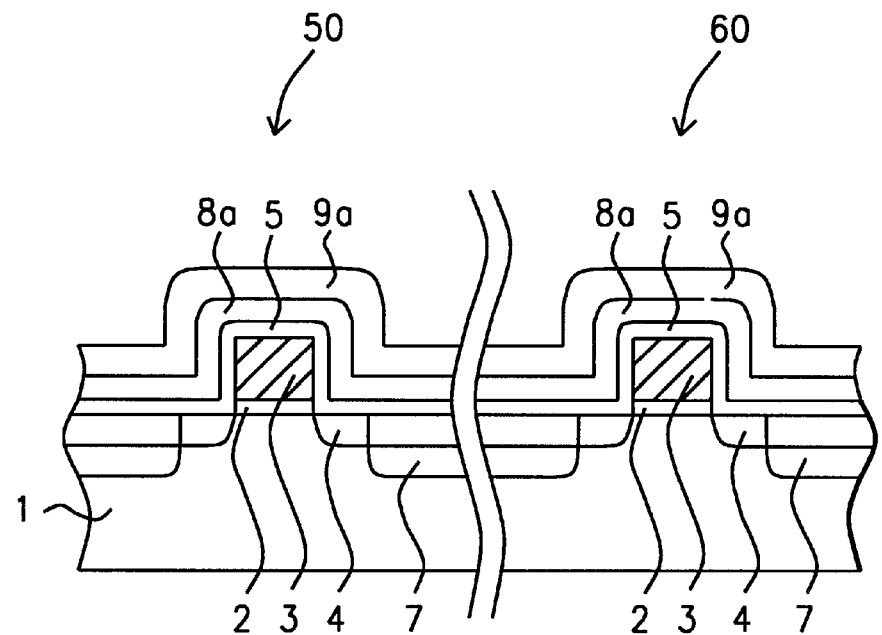

A critical, silicon nitride layer 8a, is next deposited via LPCVD procedures, to a thickness between about 150 to 300 Angstroms, using a deposition temperature between about 800 to 900° C. The use of LPCVD procedures, results in an enhanced barrier layer, when compared to counterpart silicon nitride layers, deposited at lower temperatures, via PECVD procedures. The LPCVD silicon nitride layer, at a thickness of only between about 150 to 300 Angstroms, will still be impermeable to subsequent salicide formation processes, where a less dense, PECVD silicon nitride layer, deposited at lower temperatures, may not survive the same salicide procedure. A second organic layer 9a, is next applied, at a thickness between about 400 to 800 Angstroms, with second organic layer 9a, again being comprised of propylene glycol monomethyl ether, which is sometimes used as a BARC layer. This is schematically shown in FIG. 4.

Figure 5:
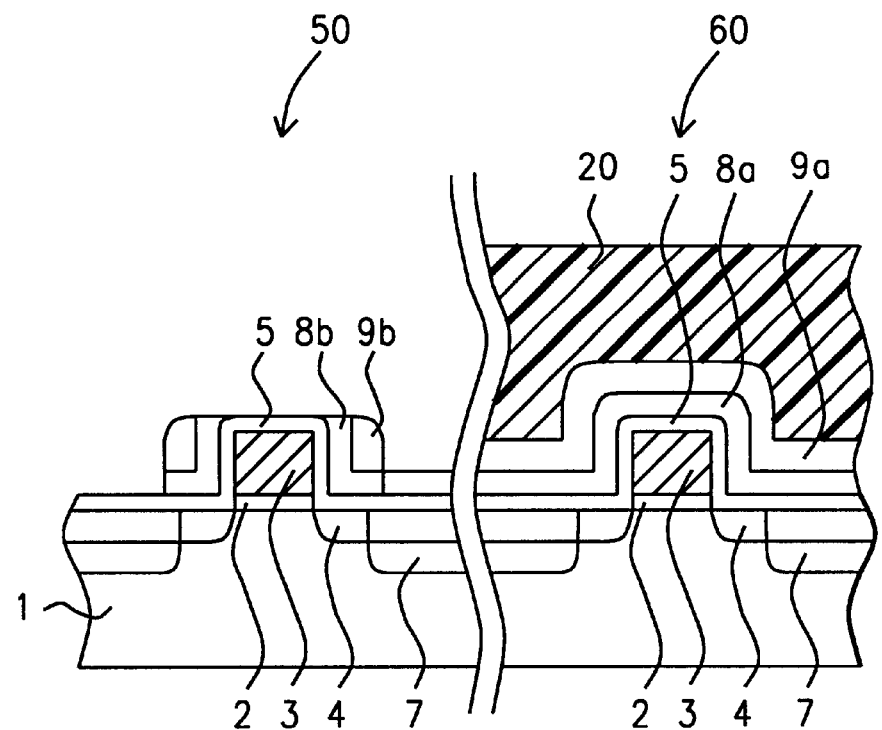
Figure 6:
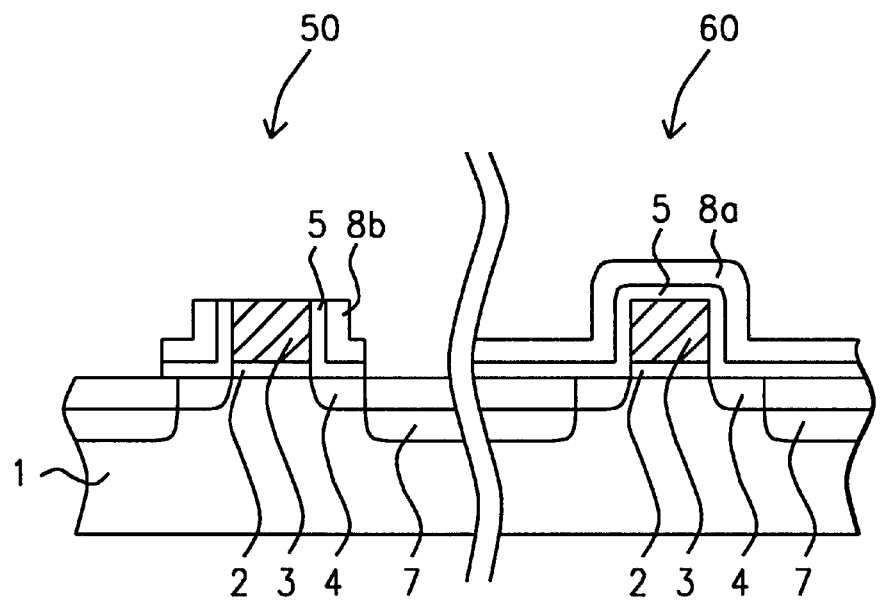

A photoresist shape 20, is used to protect CMOS memory region 60, from an anisotropic RIE procedure, used to create a composite spacer, on the sides of the polysilicon gate structures 3, in CMOS logic region 50. The anisotropic RIE procedure is performed using $CF_4/HBr/O_2$ or $Cl_2/O_2$ as an etchant for second organic layer 9a, while using $SF_6/HBr$ or $CF_4/HBr$ as an etchant for silicon nitride layer 8a, resulting in the formation of the composite spacer, comprised of second organic shape 9b, and L shaped, silicon nitride 8b. This is shown schematically in FIG. 5. A plasma oxygen ashing, or an organic wet strip, is then used to remove photoresist shape 20, and second organic layer 9a, in CMOS memory region 60, resulting in polysilicon gate structures 3, as well as heavily doped source/drain regions 7, in CMOS memory region 60, still covered by silicon nitride layer 8a. The same stripping procedures remove second organic shape 9b, from the composite spacer, in CMOS logic region 50, resulting in L shaped silicon nitride spacers 8b, on the sides of polysilicon gate structures, as well as exposing the top surface of heavily doped source/drain regions 7, in CMOS logic region 50. A wet etch clean procedure, performed after the plasma, or wet strip of photoresist shape 20, includes a buffered hydrofluoric acid cycle, resulting in the removal of regions of thin silicon oxide layer 5. The result of these procedures is schematically shown in FIG. 6.

Figure 7:
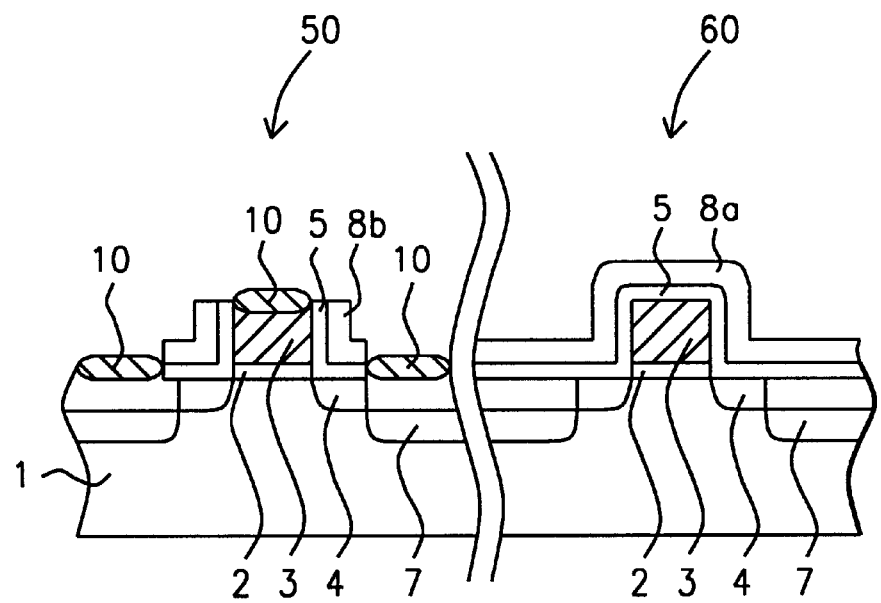

Selective formation of metal silicide, or salicide formation, on exposed silicon or polysilicon surfaces, in CMOS logic region 50, is next performed. A metal layer, such as titanium, is deposited via plasma vapor deposition procedures, at a thickness between about 200 to 500 Angstroms. An anneal procedure, performed using rapid thermal anneal, (RTA), or conventional furnace procedures, at a temperature between about 600 to 800° C., results in the formation of metal silicide, or titanium silicide layer 10, in regions in which the metal layer resided directly on silicon, or polysilicon surfaces Regions of the metal layer, residing either on L shaped, silicon nitride spacer 8b, in CMOS logic region 50, or on silicon nitride layer 8a, in CMOS memory region 60, remains unreacted. Removal of unreacted metal, or titanium, is accomplished selectively via use of a $H_2SO_4$—$H_2O_2$—HCl—$NH_4OH$ solution, resulting in the desired salicide formation in CMOS logic region 50, with polysilicon gate to substrate shorts prevented by L shaped silicon nitride spacer 8b, which was formed from silicon nitride layer 8a. Non-salicided, CMOS memory region 60, were also protected from salicide formation via use of the same silicon nitride layer 8a. If desired a second anneal procedure can be used to reduce the resistance of metal silicide layers 10. The result of the salicide procedure is schematically shown in FIG. 7.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating a salicided CMOS device, and a non-salicided CMOS device, on a semiconductor substrate, comprising the steps of:

forming a first gate structure, on an underlying gate insulator layer, on a first region of said semiconductor substrate, to be used for the salicided CMOS device, and forming a second gate structure, on said underlying gate insulator layer, on a second region of said semiconductor substrate, to be used for said non-salicided CMOS device;

forming a first lightly doped source/drain region, in an area of said first region of said semiconductor substrate, not covered by said first gate structure, and forming a second lightly doped source/drain region, in an area of said second region of said semiconductor substrate, not covered by said second gate structure;

depositing a silicon oxide layer;

applying a first organic layer;

performing a first anisotropic RIE procedure to create organic spacers, on the sides of said first gate structure, and on the sides of said second gate structure;

forming heavily doped source/drain regions, in an area of said first region of said semiconductor substrate, and in an area of said second region of said semiconductor substrate, not covered by gate structures, or by said organic spacers;

removing said organic spacers;

depositing a silicon nitride layer via low pressure chemical vapor deposition procedures, at a temperature between about 800 to 900° C.;

applying a second organic layer;

performing a second anisotropic RIE procedure, in said first region of said semiconductor substrate, to form a composite spacer on the sides of said first gate structure, with said composite spacer comprised of an overlying, organic shape, and an underlying, L shape, silicon nitride configuration;

removing said second organic layer from the top surface of said silicon nitride layer, in said second region of said semiconductor substrate, and removing said organic shape, from the surface of said L shape, silicon nitride configuration;

removing regions of said silicon oxide layer from the top surface of said first gate structure, and from the top surface of said heavily doped source/drain region, located in said first region of said semiconductor substrate;

depositing a metal layer;

performing an anneal procedure to form a metal silicide layer on the top surface of said first gate structure, and on the top surface of said heavily doped source/drain region located in said first region of said semiconductor substrate, while said metal layer, located on said L shaped, silicon nitride configuration, in said first region of said semiconductor substrate, and said metal layer, overlying said silicon nitride layer, in said second region of said semiconductor substrate, remains unreacted; and removing unreacted metal from the top surface of said silicon nitride layer in said second region of said semiconductor substrate, resulting in said non-salicided CMOS device, and removing unreacted metal from the surface of said L shaped, silicon nitride configuration, in said first region of said semiconductor substrate, resulting in said salicided CMOS device.

2. The method of claim 1, wherein said first gate structure, and said second gate structure, are polysilicon gate structures, formed from a polysilicon layer obtained via LPCVD procedures, at a thickness between about 1000 to 3000 Angstroms, with the polysilicon layer either doped in situ, during deposition, via the addition of arsine, or phosphine, to a silane ambient, or the polysilicon layer deposited intrinsically, then doped via implantation of arsenic, or phosphorous ions.

3. The method of claim 1, wherein said gate insulator layer is a silicon dioxide layer, obtained via thermal oxidation procedures, at a thickness between about 10 to 100 Angstroms.

4. The method of claim 1, wherein said silicon oxide layer is obtained via LPCV D or PECVD procedures, at a thickness between about 100 to 250 Angstroms.

5. The method of claim 1, wherein said first organic layer is comprised of propylene glycol monomethyl ether, applied at a thickness between about 600 to 1000 Angstroms.

6. The method of claim 1, wherein said first anisotropic RIE procedure, used to create said organic spacers, is performed using $CF_4/HBr/O_2$ or $Cl_2/O_2$ as an etchant.

7. The method of claim 1, wherein said silicon nitride layer is obtained at a thickness between about 150 to 300 Angstroms.

8. The method of claim 1, wherein said second organic layer is comprised of propylene glycol monomethyl ether, applied at a thickness between about 400 to 800 Angstroms.

9. The method of claim 1, wherein said composite spacer is formed via said second anisotropic RIE procedure, using $CF_4/HBr/O_2$ or $Cl_2/O_2$ as an etchant for said second organic layer, and using $SF_6/HBr$ or $CF_4/HBr$ as an etchant for said silicon nitride layer.

10. The method of claim 1, wherein said organic shape, and said second organic layer, is removed via plasma oxygen ashing procedures.

11. The method of claim 1, wherein said metal, used to form said metal silicide layers, is a titanium layer, obtained via plasma vapor deposition procedures, at a thickness between about 200 to 500 Angstroms.

12. The method of claim 1, wherein said anneal procedure, used to form said metal silicide layers, is performed using either a rapid thermal anneal procedure, or a conventional furnace anneal procedure, at a temperature between about 600 to 800° C.

13. A method of fabricating a salicided CMOS device on a first region of a semiconductor substrate, featuring a L shaped spacer, formed from a silicon nitride layer, and fabricating a non-salicided CMOS device on a second region of said semiconductor substrate, featuring a salicide blocking shape, formed from said silicon nitride layer, comprising the steps of growing a silicon dioxide gate insulator layer on said semiconductor substrate;

forming a first polysilicon gate structure on said silicon dioxide gate insulator layer, on said first region of said semiconductor substrate, and forming a second polysilicon gate structure on said silicon dioxide gate insulator layer, on a second region of said semiconductor substrate, forming lightly doped source/drain regions in areas of said semiconductor substrate not covered by either said first polysilicon gate structure, or by said second polysilicon gate structure;

depositing a thin silicon oxide layer;

applying a first organic layer;

performing a first anisotropic RIE procedure to create disposable organic spacers on the sides of the polysilicon gate structures;

forming heavily doped source/drain regions in an area of said semiconductor substrate not covered by the polysilicon gate structures, or by said disposable organic spacers, removing said disposable organic spacers;

depositing said silicon nitride layer, via LPCVD procedures at a temperature between about 800 to 900° C.;

applying a second organic layer;

forming a photoresist shape on said second organic layer, on said second region of said semiconductor substrate;

performing a second anisotropic RIE procedure to form composite spacers on the sides of said first polysilicon gate structure, with said composite spacers comprised of an overlying organic shape, and an underlying. L shaped, silicon nitride configuration, performing a plasma oxygen ashing procedure to remove said photoresist shape, and to remove the portion of said second organic layer, in said second region of said semiconductor substrate, exposing the top surface of said silicon nitride layer, and to remove said organic shape, of said composite spacers, in said first region of said semiconductor substrate, removing exposed regions of said thin silicon oxide layer, in said first region of said semiconductor substrate, exposing the top surface of said first polysilicon gate structure, and exposing the top surface of said heavily doped source/drain regions, located in said first region of said semiconductor substrate;

depositing a titanium layer;

performing an anneal procedure to form a titanium silicide layer on top surface of said first polysilicon gate structure, and on the top surface of said heavily doped source/drain regions, in said first region of said semiconductor substrate, while unreacted titanium remains on said L shaped, silicon nitride configuration, in said first region of said semiconductor substrate, and on the portion of said silicon nitride layer, located in said second region of said semiconductor substrate; and removing regions of said unreacted titanium from said L shaped, silicon nitride configuration, resulting in said salicided CMOS device, on said first region of said semiconductor substrate, and removing said unreacted titanium from the top surface of said silicon nitride layer, in said second region of said semiconductor substrate, resulting in said non-salicided CMOS device.

14. The method of claim 13, wherein said silicon dioxide gate insulator layer is obtained via thermal oxidation procedures, at a thickness between about 10 to 100 Angstroms.

15. The method of claim 13, wherein said first polysilicon gate structure, and said second polysilicon gate structure, are formed from a polysilicon layer obtained via LPCVD procedures, at a thickness between about 1000 to 3000 Angstroms, with the polysilicon layer either doped in situ, during deposition, via the addition of arsine, or phosphine, to a silane ambient, or the polysilicon layer deposited intrinsically, then doped via implantation of arsenic, or phosphorous ions.

16. The method of claim 13, wherein said lightly doped source/drain regions are formed via ion implantation of arsenic or phosphorous ions, at an energy between about 3 to 40 KeV, at a dose between about 1E13 to 1E15 atoms/$cm^2$.

17. The method of claim 13, wherein said thin silicon oxide layer is obtained via LPCVD or PECVD procedures, at a thickness between about 100 to 250 Angstroms.

18. The method of claim 13, wherein said first organic layer is comprised of propylene glycol monomethyl ether, applied at a thickness between about 600 to 1000 Angstroms.

19. The method of claim 13, wherein said first anisotropic RIE procedure, used to create said disposable organic spacers, is performed using $CF_4/HBr/O_2$ or $Cl_2/O_2$ as an etchant.

20. The method of claim 13, wherein said heavily doped source/drain regions are formed via ion implantation of arsenic, or phosphorous ions, at an energy between about 30 to 100 KeV, at a dose between about 1E15 to 1E16 atoms/$cm^2$.

21. The method of claim 13, wherein said silicon nitride layer, is obtained at a thickness between about 150 to 300 Angstroms.

22. The method of claim 13, wherein said second organic layer is comprised of propylene glycol monomethyl ether, applied at a thickness between about 400 to 800 Angstroms.

23. The method of claim 13, wherein said second anisotropic RIE procedure, used to form composite spacers, is performed using $CF_4/HBr/O_2$ or $Cl_2/O_2$ as an etchant for said second organic layer, and using $SF_6/HBr$ or $CF_4/HBr$ as an etchant for said silicon nitride layer.

24. The method of claim 13, wherein said titanium layer is obtained via plasma vapor deposition procedures, at a thickness between about 200 to 500 Angstroms.

25. The method of claim 13, wherein said anneal procedure, used to form said titanium silicide layers, is performed using either a rapid thermal anneal procedure, or a conventional furnace anneal procedure, at a temperature between about 600 to 800° C.

* * * * *